United States Patent
Cheema et al.

[11] Patent Number: 5,258,263
[45] Date of Patent: Nov. 2, 1993

[54] PRINTING PLATE AND METHODS OF MAKING AND USE SAME

[75] Inventors: Zafarullah K. Cheema, Wellesley; Anthony C. Giudice, Wakefield; Eugene L. Langlais, Norfolk, all of Mass.; Clarence F. St. Jacques, Pawtucket, R.I.

[73] Assignee: Polaroid Corporation, Cambridge, Mass.

[21] Appl. No.: 757,076

[22] Filed: Sep. 10, 1991

[51] Int. Cl.⁵ .................................. G03F 7/30
[52] U.S. Cl. .................... 430/309; 430/300; 430/302; 101/463.1; 101/465; 101/467
[58] Field of Search ............... 430/302, 309, 300, 15; 101/467, 463.1, 465, 466

[56] References Cited

U.S. PATENT DOCUMENTS

| | | | |
|---|---|---|---|
| 3,173,787 | 3/1965 | Clement et al. | 96/33 |
| 3,342,601 | 9/1967 | Houle et al. | 148/6.27 |
| 3,615,435 | 10/1971 | Chu et al. | 96/28 |
| 3,649,271 | 3/1972 | Vrancken et al. | 96/33 |
| 3,672,892 | 6/1972 | Nicolas et al. | 96/33 |
| 3,793,033 | 2/1974 | Mukherjee | 96/115 |
| 3,836,366 | 9/1974 | Silver | 96/33 |
| 3,877,948 | 4/1975 | Yonezawa et al. | 96/93 |
| 4,104,072 | 8/1978 | Golda et al. | 430/302 |
| 4,198,236 | 4/1980 | Held | 430/306 |
| 4,233,390 | 11/1980 | Jargiello | 430/302 |
| 4,235,958 | 11/1980 | Barraud et al. | 430/281 |
| 4,273,851 | 6/1981 | Muzyczko et al. | 430/175 |
| 4,356,251 | 10/1982 | Cohen et al. | 430/253 |
| 4,492,616 | 1/1985 | Pliefke et al. | 204/33 |
| 4,588,669 | 5/1986 | Asano | 430/302 |
| 4,725,524 | 2/1988 | Elzer et al. | 430/258 |

FOREIGN PATENT DOCUMENTS

| | | |
|---|---|---|
| 0186091 | 7/1986 | European Pat. Off. |
| 2340323 | 2/1975 | Fed. Rep. of Germany |
| 1482665 | 8/1977 | United Kingdom |
| 2237887 | 5/1991 | United Kingdom |

*Primary Examiner*—Marion E. McCamish
*Assistant Examiner*—Janis L. Dote
*Attorney, Agent, or Firm*—Louis G. Xiarhos

[57] ABSTRACT

A lithographic printing plate for use on a printing press, with minimal or no additional processing after photoexposure, comprises a printing plate substrate; a photosensitive hydrophilic layer having a polymeric hydrophilic binder and a photopolymerizable, photocrosslinkable or photorearrangeable compound capable of promoting insolubilization or hardening in areas of photoexposure; and a photosensitive hydrophobic layer having a polymeric hydrophobic binder and a photopolymerizable, photocrosslinkable or photorearrangeable compound capable of promoting insolubilization or hardening in areas of photoexposure.

6 Claims, 2 Drawing Sheets

PRINTING PLATE AND METHODS OF MAKING AND USE SAME

BACKGROUND OF THE INVENTION

This invention relates to a printing plate and to methods of manufacturing and using a printing plate. More particularly, it relates to a lithographic printing plate which is ready for use on a printing press with minimal or no additional processing after exposure.

The production of lithographic printing plates, particularly those based upon an aluminum sheet-like support, has been well known in the graphic arts. Such printing plates are typically of the planographic type and printing is accomplished from a substantially flat surface where printing areas are neither raised appreciably above nor depressed below adjacent and surrounding non-printing areas. In general, these plates comprise hydrophobic (water-repelling) ink-receptive image areas and hydrophilic (ink-repelling) water-receptive non-image areas. The hydrophilic non-image areas are typically hydrophilic surfaces bared by an imagewise development process. Thus, non-image areas of photoresist material can, for example, be washed or otherwise removed, to bare a hydrophilic resinous layer, an aluminum (or other metal plate) surface, an anodized aluminum (or other metal plate) surface or a metal plate having a phosphate- or silicate-treated hydrophilic surface. As is described in U.S. Pat. No. 3,836,366 (issued Sep. 17, 1974 to J. L. Silver), non-image hydrophilic areas of a printing plate may undergo a loss of water receptivity because of corrosion and pitting, with the consequence that a protective hydrophilic coating, such as of gum arabic, may be applied periodically ("gumming" of the plate) to keep a protective hydrophilic coating in the non-image areas. Among disadvantages mentioned in the patent, with respect to hydrophilic resinous coatings that may be used to provide the desired hydrophilic surface, is the tendency for the hydrophilic or water-attracting character of the non-image areas to disappear gradually over extended usage and the tendency of such material to "scum", i.e., to become gradually oleophilic and ink receptive.

The gradual loss of hydrophilicity resulting from "scumming" shortens the useful life of the plate. Moreover, deterioration of the hydrophilic resinous material may not be confined to bared areas only and may extend to adjacent portions of the layer which underlie desired hydrophobic areas, with resulting "undercutting" of desired oleophilic printing areas and loss of print quality. Attempts to overcome the loss in hydrophilicity, for example, by periodic "gumming" of the plate, may in turn promote "blinding" of the plate, i.e., a reduction in hydrophobicity of ink-receptive (image) areas of the plate.

In the production of a printing plate, a development step will normally be conducted after a photo-exposure step, to remove imagewise, non-exposed or exposed regions, depending, for example, whether a negative-working or positive-working photoresist, respectively, is used over the hydrophilic surface. The development process will usually involve washing and rinsing operations which may be assisted by rubbing or brushing. Other operations such as plate "gumming" may also be performed. These operations conducted by the plate-maker are conventional in the printing field and it will be appreciated, therefore, that there will be considerable attractiveness for a plate-making process that is not dependent upon the conduct of a wet development process and which permits the use of the plate directly after exposure and without further required processing.

SUMMARY OF THE INVENTION

It has been found that a planographic printing plate having low scumming tendencies, and which can be used on a printing press directly after exposure and with little or no required additional processing, can be obtained by employing on a printing plate substrate, in order, a photosensitive hydrophilic layer comprising a polymeric hydrophilic binder and a photopolymerizable, photocrosslinkable or photorearrangeable compound capable of promoting insolubilization or hardening in areas of photoexposure; and, thereover, a photosensitive hydrophobic layer comprising a polymeric hydrophobic binder and a photopolymerizable, photocrosslinkable or photorearrangeable compound capable of promoting insolubilization or hardening in areas of photoexposure. Upon photoexposure of the resulting layers for production of a printing plate, the photopolymerizable, photocrosslinkable or photorearrangeable compound (referred to hereinafter, for convenience, as the "photoactive compound") of the photosensitive hydrophobic layer promotes insolubilization or hardening in exposed areas to provide hydrophobic (oleophilic and ink-receptive) printing areas. Simultaneously, areas of the photosensitive hydrophilic layer underlying the exposed areas of the photosensitive hydrophobic layer are also photoinsolubilized or photohardened to provide the exposed areas thereof with improved hardness and durability. The exposed plate can be mounted directly onto a printing press and used for lithographic printing according to known printing methodology.

According to an article aspect of the invention, there is provided a planographic printing plate comprising, in order:

a printing plate substrate;

a polymeric photosensitive hydrophilic layer comprising a hydrophilic macromolecular organic binder and a photopolymerizable, photocrosslinkable or photorearrangeable compound capable of promoting insolubilization or hardening in areas of photoexposure; and a polymeric photosensitive hydrophobic layer comprising a hydrophobic macromolecular organic binder and a photopolymerizable, photocrosslinkable or photorearrangeable compound capable of promoting insolubilization or hardening in areas of photoexposure;

photoexposed areas of each of said photosensitive hydrophilic and photosensitive hydrophobic layers, respectively, being photoinsolubilized or photohardened by said photoexposure;

non-exposed areas of said photosensitive hydrophobic layer being adapted, upon their removal from said underlying polymeric hydrophilic layer after said photoexposure, to the baring of corresponding underlying areas of said polymeric hydrophilic layer.

According to a method aspect of the present invention, there is provided a method of making a photoexposed planographic printing plate for use on a printing press which comprises providing, in order, onto a printing plate substrate, polymeric hydrophilic and hydrophobic photosensitive layers, respectively, as aforedescribed; photoexposing simultaneously areas of each of said layers, sufficiently to photoinsolubilize or photoharden each of said layers in said areas; and removing non-exposed areas of said polymeric hydrophobic layer, thereby to bare underlying areas of said polymeric hydrophilic layer.

According to still another method aspect of the present invention, there is provided a method of printing lithographically which comprises preparing a photoexposed planographic printing plate by photoexposing simultaneously areas of the hydrophilic and hydrophobic layers of a printing plate as aforedescribed; placing the photoexposed planographic printing plate, without washing or other wet processing, onto a printing press adapted for contact of said planographic printing plate by at least an oleophilic printing ink and an aqueous fountain solution; and operating said printing press.

For a fuller understanding of the nature and objects of the invention, reference should be had to the following detailed description taken in conjunction with the accompanying drawings.

DETAILED DESCRIPTION OF THE INVENTION

As mentioned previously, the planographic printing plate of the invention includes photosensitive hydrophilic and hydrophobic layers carried on a printing plate substrate and is photoexposable and usable on a printing press with little or no additional required processing.

Figure 1A:
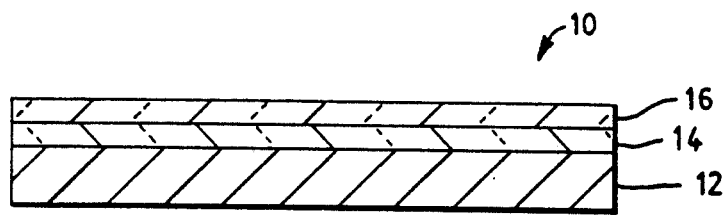
FIG. 1A is a diagrammatic cross-sectional view of a planographic printing plate of the invention.

Referring to FIG. 1, there is shown a preferred planographic printing plate 10 comprising a suitable substrate 12 carrying photosensitive hydrophilic layer 14 and photosensitive hydrophobic layer 16. Substrate 12 can comprise any of a variety of sheet-like materials of suitable durability for use in a printing operation, including plates comprising metals and metal alloys. Paper or paper laminates can be employed, as can polymeric sheets or foils such as polyethylene, polyethylene terephthalate, cellulose triacetate, polystyrene, polycarbonate and the like.

In preparing a planographic printing plate of the invention, substrate 12 will be coated to provide hydrophilic and hydrophobic layers 14 and 16, respectively. As mentioned, photoexposed areas of the respective layers are photoinsolubilized or photohardened simultaneously to provide exposed areas of the layers with improved hardness and durability. The presence of a photoactive compound in each of layers 14 and 16 promotes the desired and aforementioned photoinsolubilization or photohardening effects. As is recognized in the art, a coating support or substrate carrying radiation-sensitive (reproduction) coatings for use in the manufacture of lithographic printing plates will need to meet certain requirements, including an adequate degree of adhesion of the photosensitive coating(s) to the substrate prior to exposure, and adequate adhesion, following exposure, of portions of the coating(s) which perform the desired printing. These and other requirements of a suitable coating support for reproduction coatings are described, for example, in U.S. Pat. No. 4,492,616 (issued Jan. 8, 1985 to E. Pliefke, et al.). Thus, it will be appreciated that, while beneficial photohardening and photoinsolubilization effects promoted in layer 14 by the presence therein of a photoactive compound can be obtained where the layer is only marginally or poorly adhered to the substrate, such beneficial effects will be realized from a practical standpoint and be reflected in useful plate life only where there is an adequate degree of adhesion between substrate 12 and layer 14 coated thereon.

Suitable substrates 12 include those to which layer 14 (and layer 16 indirectly) can be adhered adequately, prior to photoexposure, and to which photoexposed printing (image) areas are adhered after photoexposure. In practice, substrate materials for use in the manufacture of printing plates will oftentimes be subjected to one or more treatments in order to improve adhesion of a photosensitive coating, or to increase the hydrophilic properties of the substrate material, and/or to improve the developability of the photosensitive coating, as is described in the aforementioned U.S. Pat. No. 4,492,616. Thus, substrate 12 will typically be treated, as by corona discharge or plasma treatment, or by a roughening or graining treatment, to promote desired adhesion of layer 14.

Especially preferred substrates 12 are the metallic substrates of aluminum, zinc, steel or copper. These include the known bi-metal and tri-metal plates such as aluminum plates having a copper or chromium layer; copper plates having a chromium layer; steel plates having copper and chromium layers; and aluminum alloy plates having a cladding of pure aluminum.

Preferred plates 12 are the grained aluminum plates, where the surface of the plate is roughened mechanically or chemically (e.g., electrochemically) or by a combination of roughening treatments. Anodized plates can be used to provide an oxide surface. Anodization can be performed in an aqueous alkaline electrolytic solution, including, for example, alkali metal hydroxides, phosphates, aluminates, carbonates and silicates, as is known in the art. An aluminum plate, grained and/or anodized, which, for example, has been treated with an aqueous alkali metal silicate, such as with sodium silicate, or which has been treated with polyvinyl phosphonic acid or otherwise provided with a resinous or polymeric hydrophilic layer, can be suitably employed as substrate 12.

Examples of printing plate substrate materials 12 which can be used in the production of printing plates of the invention, and methods of graining, anodizing and hydrophilizing such substrates are described, for example, in U.S. Pat. No. 4,153,461 (issued May 8, 1979 to G. Berghäuser, et al.); U.S. Pat. No. 4,492,616 (issued Jan. 8, 1985 to E. Pliefke, et al.); U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

In FIGS. 1A, 1B, 1C, 2 and 3, planographic printing plates are shown as diagrammatic cross-sectional representations. It will be appreciated that, depending upon the particular nature of substrate 12, and especially in the case of grained metallic substrates, substrate 12 may exhibit a surface microstructure (not shown) effective in promoting adhesion of layers thereto. Layers 14 and 16 coated thereon as thin layers will, in general, conform to the topographical nature of the substrate material.

Figure 1B:
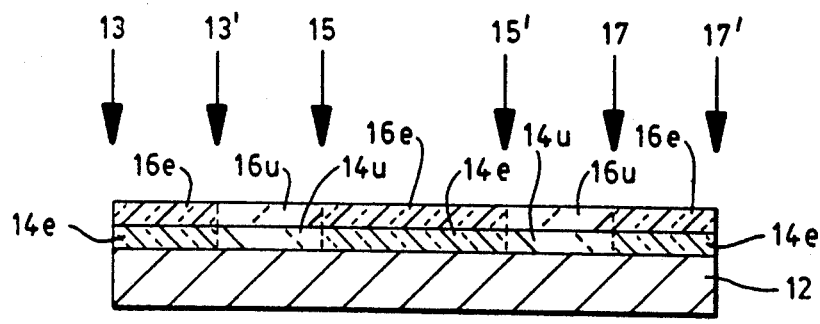
FIG. 1B is a diagrammatic cross-sectional view of the photoexposed printing plate of FIG. 1A, showing exposed and non-exposed areas, respectively, thereof.
Figure 1C:
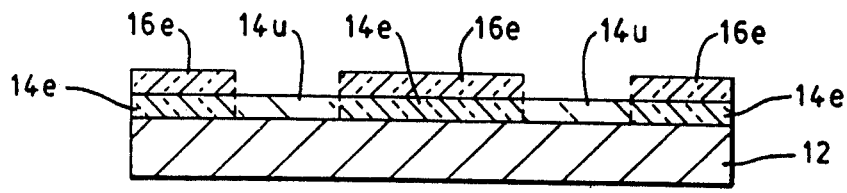
FIG. 1C is a diagrammatic cross-sectional view of the printing plate of FIG. 1B after development.

In FIG. 1B, the exposure of plate 10 to actinic radiation is shown. Areas of exposure are shown by reference to the respective arrow pairs 13 and 13', 15 and 15' and 17 and 17'. Photoexposure of plate 10 to actinic radiation effects photoinsolubilization or photohardening (e.g., photopolymerization) of layer 16 in exposed regions 16e to provide oleophilic printing areas. Simultaneously, with such exposure, layer 14 is photoinsolubilized or photohardened (e.g.,photopolymerized) in corresponding areas 14e. The photoexposed plate shown in FIG. 1B can then be developed for removal of unexposed regions 16u thereof and for the baring of the hydrophilic surfaces (underlying regions 14u of hydrophilic layer 14) which are needed for proper functioning of the printing plate. The resulting developed printing plate is shown in FIG. 1C.

Development of the photoexposed plate shown in FIG. 1B can be accomplished by washing with water or with fountain solution which is used in the printing arts. Washing can be effected by dipping, spraying or coating the plate with the washing fluid and by rinsing and drying the plate. Mechanical rubbing or brushing can be employed to assist development.

Since the photoexposed printing plate can be developed by fountain solution typically employed in a lithographic printing operation, it will be advantageous in most instances to eliminate post-exposure operations where possible or practical, and to place the photoexposed printing plate directly onto a printing press for "on-press" development. This affords notable advantages, including the elimination of post-exposure operations and the time saving associated with the elimination of conventional washing, gumming and other post-exposure operations.

Polymeric hydrophilic layer 14 provides several functions in the printing plate of the invention. Principally, it provides the hydrophilicity which is required for affinity with fountain solution and for proper functioning of the layer as an oleophobic (ink-repelling) layer. In addition, the layer is photosensitive and undergoes photoinsolubilization or photohardening in areas underlying the polymeric photosensitive hydrophobic imaging layer 16. As shown in FIGS. 1B and 1C, photoinsolubilization or photohardening occurs in areas 14e of the hydrophilic layer. The accompanying increases in molecular weight, hardness and durability of the layer contribute importantly to useful plate life, by minimizing "undercutting" in such areas and undermining of the hydrophobic printing areas 16e of the printing plate, during use on a printing press.

It will also be important to durability and useful operating life that the bared hydrophilic polymeric areas of the plate comprise polymeric material(s) coated to a durable film that retains its hydrophilicity. Advantageously, hydrophilic layer 14 should comprise polymeric material(s) from which the overlying hydrophobic layer material(s) can be removed readily, in areas 16u of non-exposure. It will be appreciated that the ready removal of non-exposed hydrophobic regions, in the fewest required steps, with the consequent baring of the desired hydrophilic printing plate surface, will afford practical advantages. As has been pointed out, such removal can be accomplished on a printing press, such that, the plate can be considered an "expose-only" or "press-developable" printing plate.

While applicants do not wish to be bound by any particular theory or mechanism in explanation of the facility with which non-exposed regions of hydrophobic polymer can be removed from underlying hydrophilic polymer, it is believed that there may be involved such factors as the nature of the hydrophobic material as a thin layer, discontinuities in the layer affording diffusion or permeation of aqueous fountain solution therethrough and removal of hydrophobic polymer, mutual physical antagonism and relatively poor adhesion between hydrophilic and hydrophobic layers, absorption of ink by hydrophobic non-exposed regions and accompanying swelling of such regions, and migration of photoactive compound from the hydrophilic layer to the interface of the hydrophilic and hydrophobic layers.

In addition to the principal binder component of layer 14, the layer will include a photoactive compound. As used herein, a photoactive compound refers to a compound or a mixture of compounds, or a reaction system of compounds, capable of promoting insolubilization or photohardening of the layer in areas of photoexposure. Suitable photoactive compounds and materials for such purposes include photopolymerizable monomers which undergo photopolymerization in areas of exposure and macromolecular (polymeric) materials having pendant photoactive groups which undergo or which promote photopolymerization, photocrosslinking or photorearrangement. Such compounds and materials are described in greater detail hereinafter.

Good results can be obtained by employing a hydrophilic layer 14 based upon a polyether polyol binder. Among suitable polyether polyols are the unbranched and the branch-chain polyether polyols, inclusive of the polyalkyleneether glycols, and the polyalkyleneether triols and tetrols, such as the polyalkyleneether glycerols and the polyalkyleneether pentaerythritols.

A preferred class of polyether polyol binders is the class of polyalkyleneether glycols which may be represented by the formula

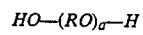

$$HO-(RO)_a-H$$

wherein R is an alkylene radical containing from 2 to about 10 carbon atoms and a is an integer sufficient to provide a molecular weight within the range of from about 400 to 50,000, and preferably, from about 650 to 20,000. Preferably, R is an alkylene radical of from 2 to 4 carbon atoms. The polyether polyol binders include homopolymers and copolymers, e.g., block copolymers. Examples of polyalkyleneether glycols useful herein include polyethyleneether glycol; polypropyleneether glycol; polyhexamethyleneether glycol; poly(ethylene-copropylene)ether glycol; polytetramethyleneether glycol; polydecamethyleneether glycol; poly 1,2-dimethyl ethyleneether glycol and the copolymer of tetrahydrofuran and 1-allyloxy-2,3-epoxypropane. The polyalkyleneether glycols herein can be readily obtained, for example, by polymerization to suitable molecular weight of an alkylene ether, e.g., ethylene oxide, tetrahydrofuran, propylene oxide, or an admixture thereof, in the presence of water or other low molecular weight alcohol or hydrogen-donor compound.

Among preferred polyether polyol binders are the block copolymer polyether compounds prepared by the controlled addition of propylene oxide to the two hydroxyl groups of propylene glycol, followed by the attachment of hydrophilic terminal groups to the resulting hydrophobe, by reaction with ethylene oxide. Good results can be obtained using such block copolymer polyether compounds having hydrophilic/lipophilic balance (HLB) values of, for example, 7 to 24. Examples of suitable block copolymer polyether compounds include those commercially available under the Pluronic trade designation of BASF Corporation.

Polyether polyols useful as binder materials in layer 14 include branch-chain polyether polyols which can be obtained by reacting glycols or alkylene oxides or mixtures thereof with compounds such as sucrose, glycerol, sorbitol, hexanetriol, pentaerythritol, phloroglucinol, trimethylol phenol, trimethylol benzene, trimethylolpropane, ethylenediamine or the like, in the presence of a suitable catalyst. Preferred branch-chain polyether polyol binders include the tetra-functional block copolymers derived from the sequential addition of propylene oxide and ethylene oxide to ethylenediamine and commercially available under the Tetronic trade designation of BASF Corporation.

Another class of polyether polyol binders useful herein comprises the class of hydroxy-containing hydrocarbon polymer materials having a molecular weight in the range of from about 400 to 6,000, wherein a number (n) of terminal hydroxyl groups are present on an n-valent saturated or unsaturated, straight or branched chain hydrocarbon polymer. Examples include the polyols obtained from the polymerization of polymerizable ethylenically unsaturated monomers, such as 1,4-butadiene, and by the introduction of hydroxyl groups in known manner. Such polyol materials are known and can be prepared, for example, by free-radical initiated polymerization of a polymerizable ethylenically unsaturated monomer to provide a dicarboxylate-substituted hydrocarbon polymer, for example, a dicarboxylate-terminated polymer. Reduction in known manner provides an aliphatic hydrocarbon polyol. A suitable method for the production of such polyol materials is described in greater detail in U.S. Pat. No. 2,888,439 (issued May 26, 1959 to D. M. Simmons).

Polyalkyleneether polyols derived from polyhydric alcohols which have three or more hydroxyl groups can be obtained by reaction, for example, of glycerol or pentaerythritol with ethylene oxide, propylene oxide or a mixture thereof. Polyfunctionality of such branch-chain polyols may be desired from the standpoint of improved cross-linking in areas 14e of layer 14.

If desired, the polymeric binder for layer 14 can comprise a polyalkylene-arylene-ether glycol. These glycols, similar in structure to the polyalkyleneether glycols, additionally contain arylene radicals, such as phenylene radicals. In general, it will be desired to minimize arylene content in the interests of achieving desired hydrophilicity in layer 14.

Especially preferred binders for layer 14 are the polyethylene glycols having a molecular weight in the range of about 400 to about 50,000. These polymers vary in solubility in water depending upon molecular weight and can be coated as solutions, dispersions or emulsions for provision of a water insoluble layer having good hydrophilicity. In addition such layers exhibit good durability, retention of desired hydrophilicity and non-scumming properties.

Photoinsolubilization or photohardening of layer 14 during exposure of plate 10 can be effected by including therein any of a variety of compounds, materials, or mixtures or reaction systems of compounds or materials capable of being altered physically by photoexposure or of promoting physical alteration (insolubilization or hardening) of the properties of the layer in areas of photoexposure. Compounds and materials suitable for this purpose include monomeric photopolymerizable compounds which undergo free-radical initiated addition polymerization. Also suitable are macromolecular or polymeric compounds having pendant groups, such as ethylenically unsaturated groups which promote crosslinking or hardening upon photoexposure or other reactive, e.g., cinnamate, groups which promote hardening by crosslinking or by photodimerization.

If desired, an unreacted mixture of copolyester precursor reactants, and a acidic photogeneratable catalyst, can be employed as a photoreactive system for the production of a copolyester. For example, a mixture of dicarboxylic and diol precursor compounds to a condensation polymer can be esterified in areas of photoexposure using an acidic photogenerated catalyst, for the production in exposed areas of a condensation polymer with accompanying and desired photohardening. Reactive monomers suited to the production of oligoesters, such as are described in U.S. Pat. No. 3,968,085 (issued Jul. 6, 1976 to G. Rabilloud, et al.), can be employed.

Especially preferred for promoting photohardening of layer 14 is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated addition polymerization. Polymerization can be effected using a photoinitiator, i.e., a free-radical generating, addition polymerization-initiating system activatable by actinic radiation. Such addition polymerization-initiating systems are known and examples thereof are described hereinafter.

Preferred polymerizable monomers are the polyfunctional acrylate monomers such as the acrylate and methacrylate esters of ethylene glycol, trimethylolpropane and pentaerythritol. These can be polymerized in exposed regions of layer 14 via homopolymerization or graft polymerization onto the binder of layer 14, in the presence of a photoinitiator. Suitable photoinitiators include the acetophenone derivatives (such as 2,2-dimethoxy-2-phenylacetophenone), benzoin or an alkyl-substituted anthraquinone, azobisisobutyro-nitrile and azobis-4-cyano-pentanoic acid, although others can be employed.

A photosensitive composition which comprises a water-soluble macromolecular binder, the polymerizable monomer and a photoinitiator, can be suitably coated into a layer which, upon photoexposure, undergoes insolubilization and hardening as the result of homopolymerization of the polymerizable monomer and grafting of the monomer onto the polymeric binder. If desired, other crosslinking agents such as those of the difunctional type (e.g., divinylbenzene) can be included in layer 14 to promote crosslinking via the unsaturated moieties thereof to the polymerizable monomer or to binder or polymerizable components of overlying layer 16.

Also suitable for use in layer 14 are preformed polymers which contain pendant reactive groups which are altered by photoexposure or which promote a change in the physical properties of layer 14 upon photoexposure. Such reactive groups include those which undergo rearrangement, polymerization or other reactions. Preferred polymers are those having pendant ethylenically unsaturated moieties which can be crosslinked by irradiation, using a photoinitiator. Preformed polymers having pendant crosslinkable groups include, for example, the reaction product of a hydroxyl-containing polymer (e.g., a polyester of a dicarboxylic acid and a polyhydric alcohol) and a vinyl monomer containing isocyanate groups (e.g., isocyanatoethyl acrylate or methacrylate). Cross-linking agents and photoinitiators can be used to provide a cross-linked polymer having urethane linkages and hardening of layer 14.

If desired, preformed polymers having pendant reactive groups such as cinnamate groups can be used to promote photoinsolubilization or photohardening. For example, polyvinyl alcohol (PVA) cinnamate formed by the esterification of hydroxyl groups of PVA using cinnamic acid, can be used to promote crosslinking by photodimerization of cinnamoyl groups.

Preformed polymers having pendant pyridinium ylide groups which groups, upon photoexposure, undergo ring expansion (photorearrangement) to a diazepine group with accompanying insolubilization can also be employed. Examples of polymers having such groups are described in U.S. Pat. No. 4,670,528 (issued Jun. 2, 1987 to L. D. Taylor, et al.).

The thickness of layer 14 can vary, although in general, it will be a thin layer. Thus, layer 14 will be of a thickness such that the layer can be readily coated to a layer exhibiting good uniformity, durability and retention of hydrophilicity. Thickness should not, however, exceed that which greatly compromises the realization of acceptable image quality. While the thickness of layer 14 will depend on and can vary in light of the aforementioned considerations and the particular nature of the hydrophilic macromolecular material utilized, good results can be obtained using a layer having a thickness in the range of about 0.1 micron to about 2 microns.

In forming layer 14 onto substrate 12, it will be preferred to apply a coating composition in the form of an oil-in-water emulsion of the polymerizable monomer (or other photohardening compound or system) in an aqueous phase of the hydrophilic binder, using a surfactant such as a nonionic alkylphenol polyethoxylate. Such an emulsion can be prepared by: introducing the polymeric binder, with agitation, into an aqueous vehicle; adding solvent (e.g., ethyl acetate) solutions of polymerizable monomer (or other photoactive compound or system) and photoinitiator, antioxidants and other additives; and by adding an aqueous surfactant solution. A hydrophilic layer obtained from a hydrophilic binder composition having a dispersed phase of the photoactive material is preferred from the standpoints of good hydrophilicity and durability. In addition, overlying non-exposed regions 16$u$ of hydrophobic layer 16 can be removed easily from such a layer, for the baring of oleophobic non-scumming regions 14$u$.

Inasmuch as the photopolymerizable monomer or other photoactive compound or system used in layer 14 will oftentimes be insoluble in the binder of such layer, or may be present in the layer as a dispersed or emulsified phase, a partial separation of such monomer, compound or system from the layer may result in the formation of localized surface concentrations or the formation of a thin layer of photoactive material between layers 14 and 16. For example, upon coating and drying a hydrophilic layer from a binder composition containing a dispersed or emulsified phase of photoactive material, there may be observed a separation or migration of dispersed photoactive material to the surface of the coated layer. As a consequence, at least a zone of the hydrophilic layer contiguous with substrate 12 may contain a relatively low concentration of such photoactive material while the surface zone of the layer remote from substrate 12 may comprise a high concentration of such photoactive material. The photoactive material may form a relatively thin surface layer of hydrophobic material separated from hydrophilic layer 14 and which serves as a tie layer for hydrophobic layer 16. The presence of localized concentrations of hydrophobic photoactive material at the interface of hydrophilic layer 14 and hydrophobic layer 16, or the presence of a separate layer (not shown) of hydrophobic photoactive material between layers 14 and 16 may be beneficial from the standpoint of enhanced photobonding of layer 14 to overlying layer 16 by crosslinking and polymer interpenetration.

Layer 16 comprises the principal imaging layer of plate 10 and comprises a hydrophobic polymeric binder and a photoactive compound which promotes insolubilization or hardening of the layer in photoexposed areas. Suitable photoactive compounds for use in layer 16 are those described in connection with layer 14. In general, however, it will be preferred to use a polymerizable monomer to effect desired photopolymerization and hardening of layer 16.

The principal component of layer 16 is a polymeric binder which provides a hydrophobic layer of suitable oleophilicity and ink receptivity. Among preferred compositions for layer 16 are compositions containing: a macromolecular organic binder; a photopolymerizable ethylenically unsaturated monomer having at least one terminal ethylenic group capable of forming a high polymer by free-radical initiated, chain-propagated addition polymerization; and a free-radical generating, addition polymerization-initiating system activatable by actinic radiation. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and chloro-2-butadiene -1, 3-polymers); polyvinyl esters (e.g., polyvinyl acetate/acrylate copolymers, polyvinyl acetate and polyvinyl acetate/methylmethacrylate copolymers); polyacrylate and polyalkylacrylate esters (e.g., polymethymethacrylate); and polyvinyl chloride copolymers (e.g., vinyl chloride/vinylacetate copolymers).

Suitable photopolymerizable ethylenically unsaturated monomers for such compositions include the difunctional and trifunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; and the ethoxylates thereof. Photoinitiators useful in the compositions for the initiation of monomer polymerization, using actinic radiation, include the aforementioned photoinitiators.

Known macromolecular binder and polymerizable monomer combinations for the production of photoresists which provide lithographic printing surfaces can be suitably employed herein for the production of layer 16. Upon photoexposure, exposed regions 16e of layer 16 are hardened by the effects of homopolymerization of the polymerizable monomer and by graft polymerization, if any, involving the macromolecular binder. It will be appreciated that areas 16e are the ink-carrying and ink-transferring areas of the printing plate of FIG. 1C and are polymerized to a degree requisite for durability and useful life of the plate.

Photoexposure of the printing plate can be accomplished according to the requirements dictated by the particular composition of layer 16 and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of layer 16 can vary with particular requirements. In general, it will be of sufficient thickness as to provide a durable photohardened printing surface. Thickness should be controlled, however, such that it can be exposed within exposure-time requirements and should not be applied at a thickness that hampers ready removal of the layer in non-exposed areas by water or fountain solution. Good results are obtained using a layer 16 having a thickness in the range of from about 0.2 micron to about 3 microns.

Upon photoexposure of plate 10, as shown in FIG. 1B, photoinsolubilization or photohardening occurs in regions 16e and 14e, simultaneously. While applicants do not wish to be bound by any particular theory or mechanism, polymer interpenetration and/or copolymerization involving polymerizable monomers in each of respective layers 14 and 16 may serve to promote a strong bonding or union between regions 14e and 16e. Thus, upon washing—before or after placement of the plate onto a printing plate—unexposed regions 16u of layer 16 (FIG. 1B) are removed for production of the printing plate shown in FIG. 1C having the desired and durable image patterned areas 16e.

Each of layers 14 and 16 can contain additional components or additives to suit particular requirements. Layer 14 can, for example, contain plasticizers, photosensitizers or catalysts appropriate to the particular photoactive compound or system employed, hardeners or other agents to improve coatability or promote desired physical properties of the layer or adhesion to substrate 12. Similarly, layer 16 can contain additives for improved coatability or adjustment of the adhesivity between layers 14 and 16. Either of layers 14 and 16 can contain antioxidant materials to prevent undesired (premature) polymerization and examples include tetrakis{ methylene(3,5-di-tert-2-butyl-4-hydroxycinnamate)} methane; thiodiethylene bis-(3,5-ditert-butyl-4 hydroxy) hydrocinnamate; and methoxy hydroquinone. Other antioxidants or mixtures thereof can, however, be employed.

Either or both of layers 14 and 16 can be provided with colorants, e.g., tint dyes, to provide a desired and predetermined visual appearance. Especially preferred will be a colorant, or a precursor of a colored species, respectively, capable either of being rendered colorless, or being provided with coloration by the irradiation of the plate-making photoexposure step. Such dye or dye-precursor compounds and the light absorption differences promoted by photoexposure allow the platemaker to distinguish readily the exposed from the non-exposed regions of the plate in advance of placing the photoexposed plate onto a printing press for the conduct of a printing run.

Figure 2:
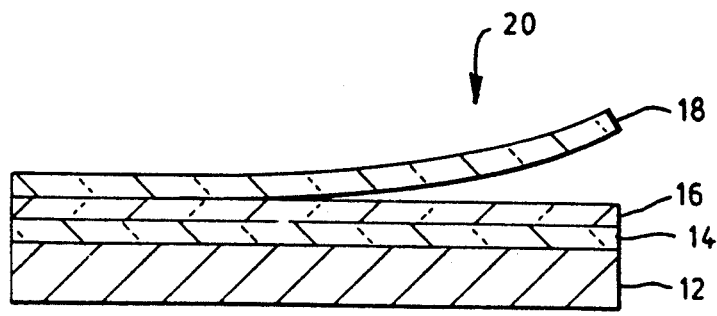
FIG. 2 is a diagrammatic cross-sectional view of a planographic printing plate of the invention equipped with a protective overlay, the overlay being shown in a state of partial removal.

If desired, plate 10 can be provided with a protective overlay for protection of surface 16 thereof against dirt and abrasion, for protection against blocking and for antioxidant protection. Such a plate is shown as article 20 in FIG. 2 and is equipped with a protective overlay 18, which is shown partially removed from the plate. Where an embodiment having a protective overlay is used, such as that shown in FIG. 2, photoexposure can be effected through overlay 18. In general, it will be preferred, however, to remove overlay 18 from the plate, as is shown in FIG. 2, prior to exposure which is accomplished in the manner previously described. Article 20 of FIG. 2 may be a preferred embodiment where the protective nature of overlay 18 is desired.

Figure 3:
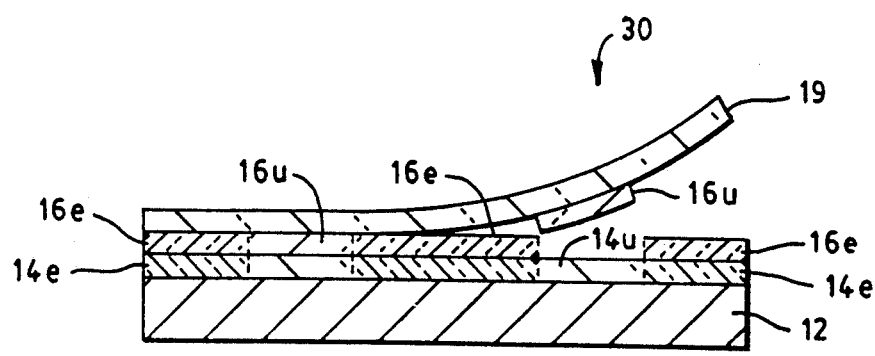
FIG. 3 is a diagrammatic cross-sectional view of a planographic printing plate of the invention equipped with a peel sheet for removal therewith of non-exposed areas of hydrophobic photosensitive material from the printing plate, the peel sheet being shown in a state of partial removal.

In FIG. 3 is shown a plate 30 of the invention wherein there is used a protective sheet which is capable of removing non-exposed portions 16u of layer 16. Protective overlay 19 can be provided with a layer (not shown) of adhesive which serves to adhere sheet 19 to layer 16 and which has a degree of adhesion to layer 16 which is greater than the adhesion of layer 16 to layer 14. It will be appreciated that the partitioning of layer 16, as shown in FIG. 3, will require that the cohesivity of layer 16 be greater than the adhesivity between layer 16 and sheet 19.

In the case of the embodiment shown in FIG. 3, photoexposure can be effected before of after adhesion of overlay 19 to layer 16. Thus, if desired, layer 16 can be photoexposed before overlayer 19 is laminated to layer 16 and, upon removal of overlayer 19 after such exposure, non-exposed portions 16u of layer 16 are removed in a one-step dry development. Alternatively, overlayer 19, provided with a layer (not shown) of adhesive as aforedescribed, can be laminated onto layer 16 before exposure through overlayer 19. Upon removal of overlayer 19 after photoexposure, partitioning of layer 16 is accomplished in the manner shown in FIG. 3 and the resulting plate can be used on a printing plate without additional required processing steps.

Various sheet-like materials can be employed as overlayers 18 and 19 in the embodiments shown in FIGS. 2 and 3. Thus, sheet or foil materials such as of polyethylene, cellulose triacetate, paper, or polyester, such as polyethylene terephthalate, can be used. Overlay sheets 18 and 19 can be opaque or transparent as dictated by particular requirements, although, in general, sheets 18 and 19 will be of transparent material. Where, for example, overlay 19 is to be positioned onto layer 16 before exposure of layer 16, the capacity of overlay 19 to remove unexposed regions of layer 16 upon its removal from the plate will dictate that exposure be effected through overlay 19 and that overlay 19 comprise a layer which transmits the actinic radiation. Clear polyester sheets are preferred overlay materials.

The following are examples representative of the present invention and are intended as being illustrative and not limitative. Except where otherwise indicated, all proportions are by weight.

EXAMPLE 1

Onto an aluminum plate having a thickness of about six mils (0.15 mm), which had been grained electrochemically, anodized and treated hydrophilically with polyvinyl phosphonic acid, was coated a hydrophilic layer having a thickness of 0.35 micron. The hydrophilic layer, coated from a composition of solids (4%) in a 92.5/3.5 solvent mixture of water and ethyl acetate, had the following composition:

| Ingredients | Percent By Weight |
|---|---|
| Polyethylene glycol wax, Mol. Wt. 17,000. (Carbowax 20M, Union Carbide Corporation) | 49.5 |
| UV Photoinitiator (2,2-dimethoxy-2-phenylacetophenone, Irgacure 651, Ciba Geigy Co.) | 4.5 |
| Antioxidant (Tetrakis{methylene(3,5-di-tert-2 butyl-4-hydroxyhydrocinnamate)}methane, Irganox 1010, Ciba Geigy Co.) | 0.5 |
| Trimethylolpropane triacrylate (Sartomer 351, Sartomer Co.) | 45.5 |
| Surfactant, octylphenoxy polyethoxy ethanol (Triton X-100, Rohm & Haas Co., added as 25% solution in water) | 2-4 drops |

The aforedescribed layer was formed in the following manner. The polyethylene glycol wax was dissolved thoroughly in the water by agitation. The photoinitiator and antioxidant were dissolved in ethyl acetate (5% solids). A sonifier was placed in the aqueous solution and activated, whereupon there were added the trimethylolpropane triacrylate and the ethyl acetate/photoinitiator/antioxidant solution, in each case, slowly within 10 to 20 seconds. Two to three drops of Triton X-100 were added per 50 g of the resulting emulsion. The emulsion was sonified thoroughly for an additional two to three minutes and was coated onto the aforedescribed aluminum plate, using a Meyer #4 rod, to provide the aforedescribed hydrophilic film of approximately 0.35-micron thickness. The film was dried for two minutes in an oven (170° F.).

Onto the hydrophilic film, a hydrophobic film was coated from a composition having 8.4% solids. The hydrophobic film had the following composition:

| Ingredients | Percent By Weight |
|---|---|
| Ethoxylated trimethylolpropane triacrylate (Sartomer 454, Sartomer Co.) | 22.0 |
| Ethoxylated trimethylolpropane triacrylate (Henkel 4155, Henkel) | 22.0 |
| High molecular weight poly(ethyl methacrylate), Elvacite 2042, E. I. duPont de Nemours and Company | 36.5 |
| Low molecular weight poly(ethyl methacrylate), Elvacite 2043, E. I. duPont de Nemours and Company | 12.0 |
| Photoinitiator, Irgacure 651 | 6.5 |
| Antioxidant, Irganox 1010 | 1.0 |

The aforedescribed hydrophobic layer was coated onto the hydrophilic layer at a thickness of approximately 0.7 micron. The resulting printing plate was placed in a UV exposure frame and exposed in a conventional manner through a target to actinic irradiation. The photoexposed plate was used on a printing press without additional processing (e.g., washing or gumming) steps. The printing plate provided resolution of 2 to 98% dots on a 150-line/in screen and a ten-micron line on the UGRA scale. The plate printed 3 to 98% dots and a ten-micron line on a Multigraphics duplicator press. Durability of the plate was good; more than 30,000 acceptable impressions were produced.

EXAMPLE 2

A coating composition (4.89% solids) was prepared from the following ingredients:

| Ingredients | Amts. (grams) |
|---|---|
| Water | 92.88 |
| Triton X-100 (25% in water) | 0.15 |
| Trimethylolpropane triacrylate | 1.15 |
| Polyethylene glycol (Carbowax 20M) | 2.00 |
| Irgacure 651 (5% in ethyl acetate) | 3.40 |

The aforedescribed coating composition was prepared in a beaker to which the water, Triton X-100 and a sonifier were placed. While sonifying the solution of surfactant, the trimethylolpropane triacrylate was added dropwise, with production of a phase inversion. The Carbowax and Irgacure ingredients were added dropwise and, upon completion of such additions, the emulsion was sonified for three minutes, with production of a very fine emulsion having sub-micron droplets.

The resulting emulsion was coated onto an aluminum plate, described as in EXAMPLE 1, to a thickness of 0.43 to 0.54 micron. The coating was dried in an oven (180° F.) for provision of a polymeric hydrophilic layer.

A coating composition (for production of a polymeric hydrophobic layer) was prepared to a solids level of 8.38% from the following ingredients, the ingredients being mixed (with the aid of a magnetic stirrer) in the order indicated and being mixed for five minutes after the final addition:

| Ingredients | Amts. (grams) |
|---|---|
| Ethyl acetate | 50.00 |
| Irgacure 651 | 0.49 |
| Irganox 1010 | 0.02 |
| Irganox 1035 (Thiodiethylene bis-(3,5 di-tert-butyl-4 hydroxy) hydrocinnamate, Ciba Geigy Co.) | 0.02 |
| Methoxy hydroquinone (0.38% in ethyl acetate) | 1.62 |
| Elvacite 2045, poly (isobutyl methacrylate), E. I. duPont de Nemours and Company | 1.50 |
| Trimethylolpropane triacrylate (99%) | 2.72 |

The resulting composition was coated onto the polymeric hydrophilic layer, using a #4 wet film applicator rod for a coating thickness of 0.70 micron. The plate was dried for three minutes in an oven at 180° F.

The printing plate was placed in a UV exposure frame and exposed through a target. The exposed plate was placed (without gumming or development steps) onto a Multi 2850S press and the press was run for 35,000 impressions, using Wikoff ink. The loss of dots in highlight regions was first observed to occur at 35,000 impressions. The plate provided resolution of 12 microlines in highlight and shadow regions. Highlight dots: 98%, shadow dots: 2%.

EXAMPLE 3

An aqueous emulsion coating was prepared from the following ingredients:

| Ingredients | Amts. (grams) |
| --- | --- |
| Carbowax 20M | 2.00 |
| Sartomer 351 | 1.85 |
| Irgacure 651 (20% in ethyl acetate) | 0.91 |
| Irganox 1010 tetrakis{methylene(3,5-di-tert-butyl-4-hydroxyhydrocinnamate)} methane (Ciba Geigy Co.) | 0.22 |
| Irganox 1035, 10% in ethyl | 0.22 |
| Triton X-100 (25% solution in water) | 0.10 |
| Distilled water | 48.00 |

The aforedescribed emulsion was prepared by dissolving the Carbowax 20M in the water and sonifying while adding the Sartomer 351 dropwise. The Irgacure 651, Irganox 1010 and Irganox 1035 solutions were mixed together and added dropwise. The Triton X-100 was then added dropwise and the emulsion was sonified for three minutes. The oil-in-water emulsion was coated to a wet thickness of 9 microns onto an aluminum plate, described as in EXAMPLE 1, using a #4 Meyer rod. The plate was dried to provide a polymeric hydrophilic layer.

A solvent coating composition was prepared from the following ingredients, by agitating the ingredients for 30 minutes with the aid of a magnetic stirrer.

| Ingredients | Amts. (grams) |
| --- | --- |
| Elvacite 2045 | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The solvent coating was applied onto the polymeric hydrophilic layer, using a #4 Meyer rod, to a wet thickness of 9 microns. The plate was dried and was imaged in a vacuum exposure frame, using a 5 kilowatt source at 380 nm. After exposure, the printing plate was washed for 5 to 10 seconds using water or fountain solution. In either case, the unexposed hydrophilic areas remained clean and did not scum while exposed areas showed oleophilicity (affinity for ink).

EXAMPLE 4

A polymeric hydrophilic layer was coated onto an aluminum plate in the manner described in EXAMPLE 3. Onto the hydrophilic layer there was coated a polymeric hydrophobic layer, coated (in the manner described in EXAMPLE 3) from a composition consisting of the following ingredients:

| Ingredients | Amts. (grams) |
| --- | --- |
| Elvacite 2045 | 1.50 |
| Irgacure 651 | 0.49 |
| Irganox 1010 | 0.02 |
| Irganox 1035 | 0.02 |
| Ethoxylated trimethylolpropane triacrylate (Sartomer 454, Sartomer Co.) | 2.72 |
| Ethyl acetate | 49.50 |

The coated layer was dried and the resulting planographic printing plate was imaged under the same conditions recited in EXAMPLE 3. The exposed plate was washed for ten seconds with water or fountain solution. Imaged areas showed oleophilicity (receptivity to ink) while non-imaged areas did not.

EXAMPLE 5

Onto an aluminum plate, as described in EXAMPLE 1, a polymeric hydrophilic layer was coated and dried (also in the manner described therein), using a coating composition consisting of the following:

| Ingredients | Amts. (grams) |
| --- | --- |
| Carbowax 20M | 2.00 |
| Sartomer 454 | 1.85 |
| Irgacure 651 (20% in ethyl acetate) | 0.91 |
| Irganox 1010 (10% in ethyl acetate) | 0.22 |
| Irganox 1035 (10% in ethyl acetate) | 0.22 |
| Triton X-100 (25% in water) | 0.10 |
| Distilled water | 48.00 |

A polymeric hydrophobic layer was coated onto the resulting hydrophilic layer, using the coating composition and method described in EXAMPLE 3. The plate was oven dried and was exposed in the manner described in EXAMPLE 3. The exposed plate was washed for ten seconds with water or fountain solution. Exposed areas showed oleophilicity (receptivity to ink) while non-exposed areas did not.

EXAMPLE 6

An aluminum plate carrying a polymeric hydrophilic layer was prepared according to the description of EXAMPLE 5. A polymeric hydrophobic layer was then coated onto the hydrophilic layer using the coating composition described in EXAMPLE 4. The plate was oven dried, exposed and washed, as described in EXAMPLE 5. Exposed areas of the plate showed oleophilicity while non-exposed areas did not.

EXAMPLE 7

An aluminum plate carrying a polymeric hydrophilic layer was prepared according to the description of EXAMPLE 3. A polymeric hydrophobic layer was formed onto the hydrophilic layer by coating (with a #4 Meyer rod to a wet thickness of 9 microns) a coating composition consisting of the following:

| Ingredients | Amts. (grams) |
| --- | --- |
| Polymethyl methacrylate (Elvacite 2010, E. I. duPont de Nemours and Co.) | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The plate was oven dried and exposed in a vacuum frame. The plate was washed for five to ten seconds, using water and fountain solution. Exposed areas showed ink receptivity while non-exposed areas did not.

EXAMPLE 8

An aluminum printing plate was prepared, exposed, washed and evaluated according to the procedure described in EXAMPLE 7, except that, the polymeric hydrophobic layer was coated from a composition consisting of the following:

| Ingredients | Amts. (grams) |
|---|---|
| Polymethyl methacrylate, inherent viscosity 1.25 (Elvacite 2041, E. I. duPont de Nemours and Company). | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The exposed areas of the plate showed oleophilicity (ink receptivity) while non-exposed areas did not.

EXAMPLE 9

An aluminum printing plate was prepared, exposed, washed and evaluated according to the procedure described in EXAMPLE 7, except that, the polymeric hydrophobic layer was coated from a composition consisting of the following:

| Ingredients | Amts. (grams) |
|---|---|
| Elvacite 2042 | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The exposed areas of the plate showed oleophilicity (ink receptivity) while non-exposed areas did not.

EXAMPLE 10

An aluminum printing plate was prepared, exposed, washed and evaluated according to the procedure described in EXAMPLE 7, except that, the polymeric hydrophobic layer was coated form a composition consisting of the following:

| Ingredients | Amts. (grams) |
|---|---|
| Elvacite 2044 | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The exposed areas of the plate showed oleophilicity (ink receptivity) while non-exposed areas did not.

EXAMPLE 11

An aluminum printing plate was prepared, exposed, washed and evaluated according to the procedure described in EXAMPLE 12, except that, the polymeric hydrophobic layer was coated from a composition consisting of the following:

| Ingredients | Amts. (grams) |
|---|---|
| Poly(methylmethacrylate-co-n-butylmethacrylate) Elvacite 2013, E. I. duPont de Nemours and Company | 1.50 |
| Irgacure 651 | 0.49 |
| Irganox 1010 | 0.02 |
| Irganox 1035 | 0.02 |
| Sartomer 351 | 2.72 |
| Ethyl acetate | 49.50 |

The exposed areas of the plate showed oleophilicity (ink receptivity) while non-exposed areas did not.

EXAMPLE 12

Using the procedure of EXAMPLE 3, a polymeric hydrophilic layer was coated from an emulsion onto an aluminum plate to a wet coating thickness of nine microns, using a #4 Meyer rod. The emulsion consisted of the following:

| Ingredients | Amts. (grams) |
|---|---|
| Carbowax 20M | 2.00 |
| Sartomer 351 | 1.85 |
| Irgacure 651 (20% in ethyl acetate) | 0.91 |
| Irganox 1010 (10% in ethyl acetate) | 0.22 |
| Triton X-100 (25% in water) | 0.20 |
| Distilled water | 96.0 |

Onto the dried hydrophilic layer, a polymeric hydrophobic layer was coated from a composition obtained by agitating (with a magnetic stirrer for 30 minutes) the following ingredients added slowly to the solvent vortex:

| Ingredients | Amts. (grams) |
|---|---|
| Irgacure 651 | 0.2 |
| Irganox 1010 (10% in ethyl acetate) | 0.32 |
| Polyethylene glycol dimethacrylate (Sartomer 210, Sartomer Co.) | 1.5 |
| Elvacite 2042 | 1.12 |
| Elvacite 2043 | 0.37 |
| Ethyl acetate | 33.3 |

The resulting plate was dried, exposed to UV irradiation in a vacuum frame and washed for 10 to 20 seconds with water or fountain solution. Imaged areas showed oleophilicity (ink receptivity) while non-imaged areas did not.

EXAMPLE 13

An aluminum printing plate was prepared, exposed, washed and evaluated according to the procedure described in EXAMPLE 12, except that, the polymeric hydrophobic layer was coated from a composition consisting of the following:

| Ingredients | Amts. (grams) |
|---|---|
| Ethoxylated Bisphenol A diacrylate (Sartomer 348, Sartomer Co.) | 1.5 |
| Elvacite 2042 | 1.12 |
| Elvacite 2043 | 0.37 |
| Irgacure 651 | 0.2 |
| Irganox 1010 (10% in ethyl acetate) | 0.32 |
| Ethyl acetate | 33.3 |

The exposed areas of the plate showed oleophilicity (ink receptivity) while non-exposed areas did not.

EXAMPLE 14

An aluminum printing plate was prepared, exposed, washed and evaluated according to the procedure described in EXAMPLE 12, except that, the polymeric hydrophobic layer was coated from a composition consisting of the following:

| Ingredients | Amts. (grams) |
|---|---|
| Irgacure 651 | 0.2 |
| Irganox 1010 (10% in ethyl acetate) | 0.32 |
| Neopentyl glycol diacrylate (Sartomer 247, Sartomer Co.) | 1.5 |
| Elvacite 2042 | 1.12 |
| Elvacite 2043 | 0.37 |
| Ethyl acetate | 33.3 |

The exposed areas of the plate showed oleophilicity (ink receptivity) while non-exposed areas did not.

EXAMPLE 15

An aluminum printing plate was prepared, exposed, washed and evaluated according to the procedure described in EXAMPLE 12, except that, the polymeric hydrophobic layer was coated from a composition consisting of the following:

| Ingredients | Amts. (grams) |
|---|---|
| Irgacure 651 | 0.2 |
| Irganox 1010 (10% in ethyl acetate) | 0.32 |
| Sartomer 351 | 1.5 |
| Elvacite 2042 | 1.12 |
| Elvacite 2043 | 0.37 |
| Ethyl acetate | 33.3 |

The exposed areas of the plate showed oleophilicity (ink receptivity) while non-exposed areas did not.

EXAMPLE 16

An aluminum printing plate was prepared, exposed, washed and evaluated according to the procedure described in EXAMPLE 12, except that, the polymeric hydrophobic layer was coated from a composition consisting of the following:

| Ingredients | Amts. (grams) |
|---|---|
| Ethoxylated trimethylolpropane triacrylate, (Sartomer 454, Sartomer Co.) | 1.5 |
| Elvacite 2042 | 1.12 |
| Elvacite 2043 | 0.37 |
| Irgacure 651 | 0.2 |
| Irganox 1010 (10% methyl acetate) | 0.2 |
| Ethyl acetate | 33.3 |

The exposed areas of the plate showed oleophilicity (ink receptivity) while non-exposed areas did not.

An aluminum plate, prepared as described, was exposed, washed with water and allowed to set under ambient conditions for five days, without having been gummed. The plate was then placed onto a printing press and produced at least 500 copies without scumming. An aluminum printing plate, also prepared as described, was exposed, and without further processing, was placed onto a printing press supplied with ink and with water in place of the conventional fountain solution. At least 200 copies were run. The water (fountain solution replacement) permitted on-press development.

EXAMPLES 17 to 24

Printing plates were prepared, exposed, washed and evaluated according to the procedure described in EXAMPLE 12, except that, the polymeric hydrophobic imaging layer in each of the following examples was prepared by coating a composition consisting of, respectively:

| | EXAMPLES | | | | | | | |
|---|---|---|---|---|---|---|---|---|
| | 17 | 18 | 19 | 20 | 21 | 22 | 23 | 24 |
| Ingredients | (amounts in grams) | | | | | | | |
| Irgacure 651 | 0.20 | 0.20 | 0.20 | 0.20 | 0.20 | 0.20 | 0.20 | 0.20 |
| Irganox 1010 (10% in ethyl acetate) | 0.32 | 0.32 | 0.32 | 0.32 | 0.32 | 0.32 | 0.32 | 0.32 |
| Dipentaerythritol pentaacrylate (Sartomer 399) | 1.50 | -0- | -0- | -0- | -0- | -0- | -0- | -0- |
| Pentaerythritol triacrylate (Sartomer 444) | -0- | 1.50 | -0- | -0- | -0- | -0- | -0- | -0- |
| Pentaerythritol tetraacrylate (Sartomer 295) | -0- | -0- | 1.50 | -0- | -0- | -0- | -0- | -0- |
| Bisphenol A ethoxylate diacrylate (Henkel 4025) | -0- | -0- | -0- | 1.50 | -0- | -0- | -0- | -0- |
| Modified difunctional acrylic ester oligomer (Henkel 3071) | -0- | -0- | -0- | -0- | 1.50 | -0- | -0- | -0- |
| Trimethylolpropane polethoxy triacrylate (Henkel 4155) | -0- | -0- | -0- | -0- | -0- | 1.50 | -0- | -0- |
| Polybutadiene diacrylate (Poly bd 300) | -0- | -0- | -0- | -0- | -0- | -0- | 1.50 | -0- |
| Hydroxy-terminated polybutadiene (Poly bd R45HT) | -0- | -0- | -0- | -0- | -0- | -0- | -0- | 1.50 |
| Elvacite 2042 | 1.12 | 1.12 | 1.12 | 1.12 | 1.12 | 1.12 | 1.12 | 1.12 |
| Elvacite 2043 | 0.37 | 0.37 | 0.37 | 0.37 | 0.37 | 0.37 | 0.37 | 0.37 |
| Ethylacetate | 33.3 | 33.3 | 33.3 | 33.3 | 33.3 | 33.3 | 33.3 | 33.3 |

EXAMPLES 25 to 32

Lithographic printing plates were prepared in the manner described in EXAMPLE 1, using a printing plate substrate as described therein; a hydrophilic layer coated to a coverage of 300 mgs/m² from a coating formulation (Formulation 25 to 32) as follows; and a hydrophobic imaging layer applied with a #4 Meyer rod, using a composition having the following ingredients:

| Ingredients | Amts. (grams) |
| --- | --- |
| Ethyl acetate | 45.0 |
| Irganox 1010 (10% in ethyl acetate) | 0.2 |
| ITX (3% in ethyl acetate) | 0.34 |
| Irgacure 369 (5% in ethyl acetate) | 0.62 |
| Elvacite 2042 | 2.27 |
| TMPTA | 1.67 |

The hydrophilic coating formulation in each case was run twice through a microfluidizer to provide an oil-in-water emulsion which was coated by wire bar onto the hydrophilized grained and anodized aluminum substrate. EXAMPLES 25 to 32 illustrate the use of hydrophilic binders of the ethylene oxide/propylene oxide block copolymer and cellulose ether types.

| | Amts. (grams) |
| --- | --- |
| Formulation 25 | |
| Ethylenediamine/propylene oxide/ethylene oxide block copolymer (Tetronics 1107, 20% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone (Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 26 | |
| Propylene oxide/ethylene oxide block copolymer (Pluronics F87, 20% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone, Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 27 | |
| Ethylenediamine/propylene oxide/ethylene oxide block copolymer (Tetronics 908 20% in water) | 10.00 |
| Trimethylolpropane Triacrylate (TMPTA) | 1.84 |
| Irganox 1010 (4% in water ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 28 | |
| Propylene oxide/ethylene oxide block copolymer (Pluronics F127, (20% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 29 | |
| Hydroxypropyl methylcellulose (Methocel E15LV, Dow Chemical Company, 2% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 30 | |
| Hydroxypropyl methylcellulose (Methocel E50LV, Dow Chemical Company 2% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 31 | |
| Hydroxypropyl methylcellulose (Methocel F50LV, Dow Chemical Company 2% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |
| Formulation 32 | |
| Hydroxypropyl methylcellulose (Methocel K35LV, Dow Chemical Company 2% in water) | 10.00 |
| Trimethylolpropane Triacrylate (TMPTA) | 1.84 |
| Irganox 1010 (4% in ethyl acetate) | .50 |
| 2-benzyl-2-(dimethylamino)-1-{4-(4-morpholinyl) phenyl}-1-butanone Irgacure 369, 5% in ethyl acetate) | .72 |
| Isopropyl thioxanthone (ITX), 3% in ethyl acetate | .60 |
| Triton X-100 (25% in water) | .10 |
| Deionized water | 90.00 |

The printing plates were placed onto a printing press for on-press development and were utilized for the conduct of printing runs. The plates were non-scumming and performed within the operational parameters of an acceptable printing plate.

EXAMPLE 33

Onto an aluminum plate, as described in EXAMPLE 1, a polymeric hydrophilic layer was coated and dried (also in the manner described therein), using an emulsion coating composition consisting of the following:

| Ingredients | Amts. (grams) |
| --- | --- |
| Carbowax 20M (20% in water) | 2.977 |
| PEG 8000, polyethylene glycol, Mol. Wt. 8000, Union Carbide Corporation (20% in water) | 1.98 |
| TMPTA (99%) | 0.94 |
| Irgacure 369 (5% in ethyl acetate) | 0.416 |
| Irganox 1010 (4% in ethyl acetate) | 0.075 |
| ITX (3% in ethyl acetate) | 0.23 |
| Triton X-100 (25% in water) | 0.20 |
| Deionized water | 43.18 |

A polymeric hydrophobic layer was coated onto the resulting hydrophilic layer, using the coating composition and method described in EXAMPLES 25 to 32. The plate was oven dried, photoexposed and placed onto a printing press for on-press development. The plate provided about 25,000 acceptable impressions.

COMPARATIVE EXAMPLES

For purposes of comparison with printing plates made in the manner described in the preceding EXAMPLES, the following tests were performed.

Comparative Example A—A grained, anodized and hydrophilically treated printing plate substrate, as described in EXAMPLE 1, was evaluated for hydrophilicity by wetting the plate with water and, then, rubbing the hydrophilic surface with an oleophilic ink (black protecting ink, available as RC-43 Ink from Hoechst AG). The ink was repelled by the hydrophilic surface, i.e., the wetted surface was non-scumming, showing good hydrophilicity and no affinity for the ink composition. When ink was rubbed onto the surface of such a plate without having first been wetted with water, the plate surface was scummed with ink which was not then removable by water washing.

Comparative Example B—Samples of the aluminum printing plate substrate material were coated directly with a hydrophobic binder/polymerizable monomer composition (using the compositions described in EXAMPLES 3, 4, 7, 8, 9, 10, 11, 13, 14 and 15), i.e., no resinous hydrophilic layer was first coated over the already hydrophilic surface of the printing plate substrate. The coated samples, were dried, and without photoexposure, were (1) washed under running tap water, then, rubbed with ink and (2) treated in the reverse sequence, i.e., inked, then, washed. In all instances, the hydrophobic layer showed affinity for ink, i.e., scumming. The unexposed (and un-inked) hydrophobic layer was not removable from the hydrophilic surface of the plate either by water washing or by washing with ethyl acetate. Adherence of the un-inked hydrophobic layer to the plate surface was confirmed by subsequent inking of the washed plates and observation of substantial scumming. The hydrophobic compositions were, thus, not suited for the formation of imaging layers applied directly onto the hydrophilically treated surface of the plate substrate.

Comparative Example C—Samples of the printing plate substrate were coated only with a hydrophilic, Carbowax 20M emulsion composition, using the compositions described in EXAMPLES 3 and 5. In no case was an additional hydrophobic layer applied thereover. The layers were tested at dry-film thicknesses ranging from 0.2 micron to one micron. After photoexposure to UV, through a negative mask, a faint pattern was observable on the plate. Application of ink to the resulting plate, after water washing, showed beading (repulsion) of the ink over the entire surface of the plate, some regions showing less ink repulsion than others. The plate showed no ink retention in either exposed or unexposed regions and no formation of image or printing surfaces, indicating the unsuitability of layers coated from the hydrophilic binder/polymerizable monomer compositions of EXAMPLES 3 and 5, as sole imaging layers, for production of printing plates.

Comparative Example D—A printing plate was prepared in the manner described in EXAMPLE 33, except that, in lieu of the hydrophilic layer therein described (containing photopolymerizable TMPTA monomer), there was used, a layer of polyethylene glycol, coated from an aqueous solution of Carbowax 20M (2.4 grams); PEG 8000 (1.6 grams) in water (96 grams). The resulting plate, exposed and utilized in the conduct of a printing run, produced about 7,000 acceptable impressions, as compared to the 25,000 impressions obtained from the printing plate of EXAMPLE 33.

What is claimed is:

1. A method of printing lithographically with a planographic printing plate, which comprises: providing, in order, onto an aluminum hydrophilic printing plate substrate, a polymeric photosensitive water-insoluble hydrophilic layer comprising a hydrophilic macromolecular organic binder, a photopolymerizable ethylenically unsaturated monomer capable of promoting insolubilization or hardening in areas of photoexposure, said monomer having at least one terminal ethylenic group capable of forming a high polymer by free-radical initiated, chain-propagated addition polymerization, and a free-radical generating, addition polymerization-initiating system activatable by actinic radiation, and an overlying polymeric photosensitive hydrophobic layer comprising a hydrophobic macromolecular organic binder, a photopolymerizable ethylenically unsaturated monomer capable of promoting insolubilization or hardening in areas of photoexposure, said monomer having at least one terminal ethylenic group capable of forming a high polymer by free-radical initiated, chain propagated addition polymerization, and a free-radical generating, addition polymerization-initiating system activatable by actinic radiation;

photoexposing simultaneously areas of each of said layers of said plate, sufficiently to photoinsolubilize or photoharden each of said layers in said areas;

placing said photoexposed plate, without further processing, onto a printing press, said printing press being adapted to receipt of a printing plate and being provided with an oleophilic ink and a fountain solution for contact with said plate during operation of said printing press; and operating said printing press, thereby to contact said photoexposed plate with said ink and said fountain solution during said operation and to remove with said fountain solution non-exposed areas of said hydrophobic layer for the baring of corresponding areas of said water-insoluble hydrophilic layer.

2. The method of claim 1 wherein said binder of said polymeric photosensitive water-insoluble hydrophilic layer comprises a polyalkyleneether glycol.

3. The method of claim 2 wherein said hydrophobic macromolecular organic binder of said polymeric photosensitive hydrophobic layer comprises a polyacrylate ester.

4. The method of claim 1 wherein said aluminum hydrophilic printing plate substrate comprises an aluminum plate provided with a polymeric hydrophilic layer.

5. The method of claim 4 wherein said printing plate substrate comprises a grained aluminum substrate.

6. The method of claim 1 wherein said polymeric photosensitive water-insoluble hydrophilic layer provided onto said aluminum hydrophilic printing plate substrate comprises a coated layer of said hydrophilic macromolecular organic binder having a dispersed phase therein of said photopolymerizable unsaturated monomer.

* * * * *